United States Patent
Montgomery

(10) Patent No.: US 7,615,854 B2
(45) Date of Patent: Nov. 10, 2009

(54) SEMICONDUCTOR PACKAGE THAT INCLUDES STACKED SEMICONDUCTOR DIE

(75) Inventor: Robert Montgomery, South Glamorgan (GB)

(73) Assignee: International Rectifier Corporation, El Segundo, CA (US)

( * ) Notice: Subject to any disclaimer, the term of this patent is extended or adjusted under 35 U.S.C. 154(b) by 8 days.

(21) Appl. No.: 11/592,407

(22) Filed: Nov. 3, 2006

(65) Prior Publication Data

US 2007/0108575 A1    May 17, 2007

Related U.S. Application Data

(60) Provisional application No. 60/733,283, filed on Nov. 3, 2005.

(51) Int. Cl.
| | |
|---|---|
| *H01L 23/31* | (2006.01) |
| *H01L 23/48* | (2006.01) |
| *H01L 23/28* | (2006.01) |

(52) U.S. Cl. ............... 257/678; 257/691; 257/692; 257/693; 257/E23.044

(58) Field of Classification Search ........... 257/678, 257/686, 712, 723, 778, 691–693, E23.044
See application file for complete search history.

(56) References Cited

U.S. PATENT DOCUMENTS

| | | | | |
|---|---|---|---|---|
| 5,532,512 | A | * 7/1996 | Fillion et al. | ........... 257/686 |
| 5,734,201 | A | * 3/1998 | Djennas et al. | ........... 257/783 |
| 2007/0262346 | A1 | * 11/2007 | Otremba et al. | ........... 257/177 |

* cited by examiner

*Primary Examiner*—Zandra Smith
*Assistant Examiner*—Tsz K Chiu
(74) *Attorney, Agent, or Firm*—Farjami & Farjami LLP

(57) ABSTRACT

A semiconductor package that includes at least two semiconductor devices that are coupled to one another through a conductive clip.

12 Claims, 3 Drawing Sheets

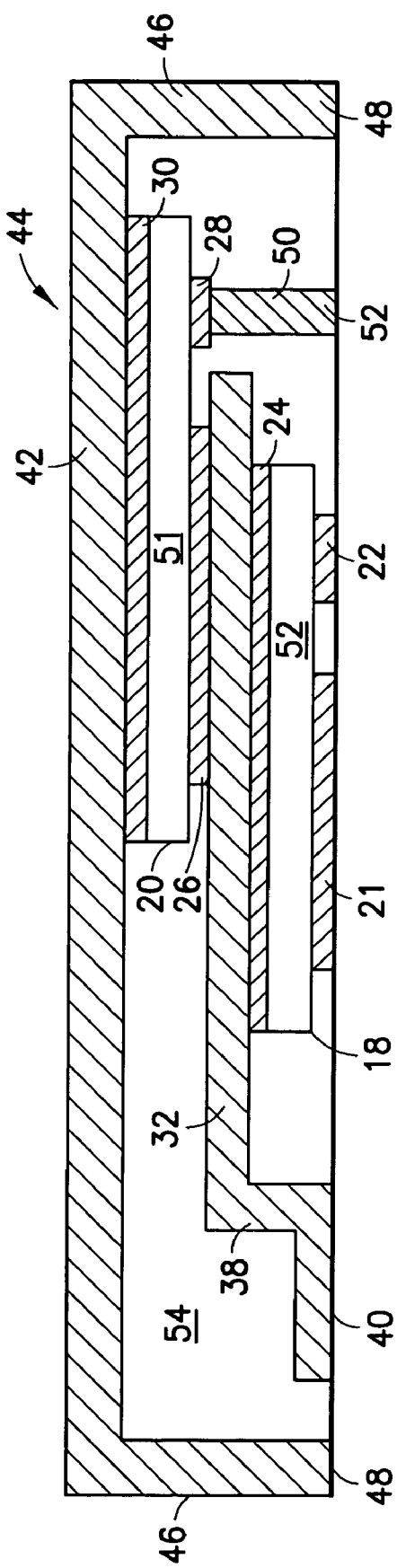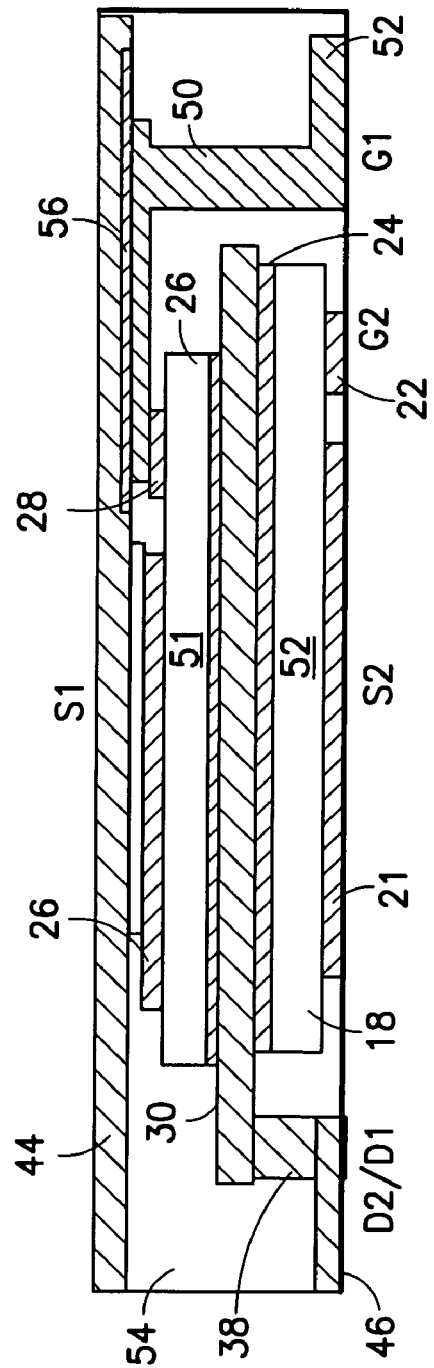

SEMICONDUCTOR PACKAGE THAT INCLUDES STACKED SEMICONDUCTOR DIE

RELATED APPLICATION

This application is based on and claims benefit of U.S. Provisional Application No. 60/733,283, filed on Nov. 3, 2005, entitled Stacked Semiconductor Die For DC/DC Converter with Reduced Foot Print, to which a claim of priority is hereby made and the disclosure of which is incorporated by reference.

FIELD OF THE INVENTION

This invention relates to semiconductor devices and more specifically relates to a novel packaging for semiconductor die.

BACKGROUND AND SUMMARY OF THE INVENTION

Many power applications require a power stage which usually includes two semiconductor switches that are operatively connected to one another. In many prior art power application applications two individual semiconductor packages are used to obtain the power stage. As a result, the space occupied on the board must accommodate at least two semiconductor packages. Furthermore, parasitics due to the extra package elements such as extra lead resistance and inductance result in less than ideal performance.

In a package according to the present invention, two power semiconductor devices are assembled in one package hence saving area on the board and reducing the consequent parasitics.

A power semiconductor package according to the present invention includes one power semiconductor device having a first power electrode and a second power electrode, another power semiconductor device having a first power electrode and a second power electrode, and a first conductive clip having a web portion and a lead extending from an edge of the web portion and terminating at a first connection surface, the web portion including a first surface electrically and mechanically connected to one of the power electrodes of the one power electrode and a second surface opposite the first surface electrically and mechanically connected to one of the power electrodes of the another power semiconductor device.

According to an aspect of the present invention a power semiconductor package may further include a second conductive clip having a web portion electrically and mechanically connected to either first or the second power electrode of the another power semiconductor device, the second conductive clip further including a lead extending from an edge of the web portion thereof and terminating at a second connection surface generally coplanar with the first connection surface.

Other features and advantages of the present invention will become apparent from the following description of the invention which refers to the accompanying drawings.

BRIEF DESCRIPTION OF THE DRAWINGS

FIG. 4 illustrates an alternative arrangement of a package according to the first embodiment.

FIG. 5 illustrates a package according to the second embodiment of the present invention.

DETAILED DESCRIPTION OF THE EMBODIMENTS

Figure 1:
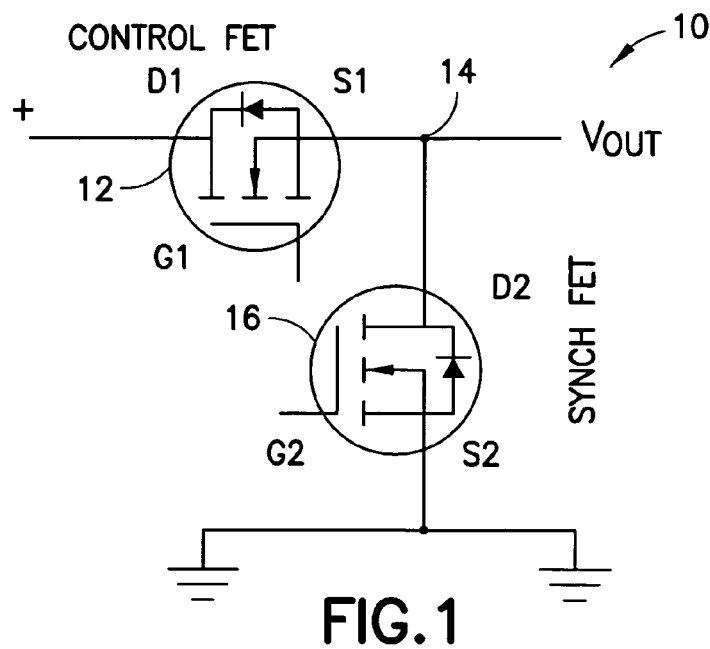
FIG. 1 is a circuit diagram of the switching stage of a buck converter (a DC/DC converter).

FIG. 1 shows the switching stage of a DC-DC converter, such as, for example, a buck converter. Switching stage 10 includes a first semiconductor switch 12, e.g., control switch, which may be a power MOSFET, series connected between the voltage input $V_T$ and a switched node 14, and a second semiconductor switch 16, e.g., a synchronous switch, which may be a power MOSFET, that is series connected between switched node 14 and the ground. Note that in a typical switching stage 10 first switch 12 may be an N-channel power MOSFET, having its drain electrode D1 connected to the input voltage, and source electrode S1 connected to switched node 14, and second switch 16 may be an N-channel MOSFET having its drain electrode D2 connected to switched node 14 and its source electrode S2 connected to the ground.

Figure 2:
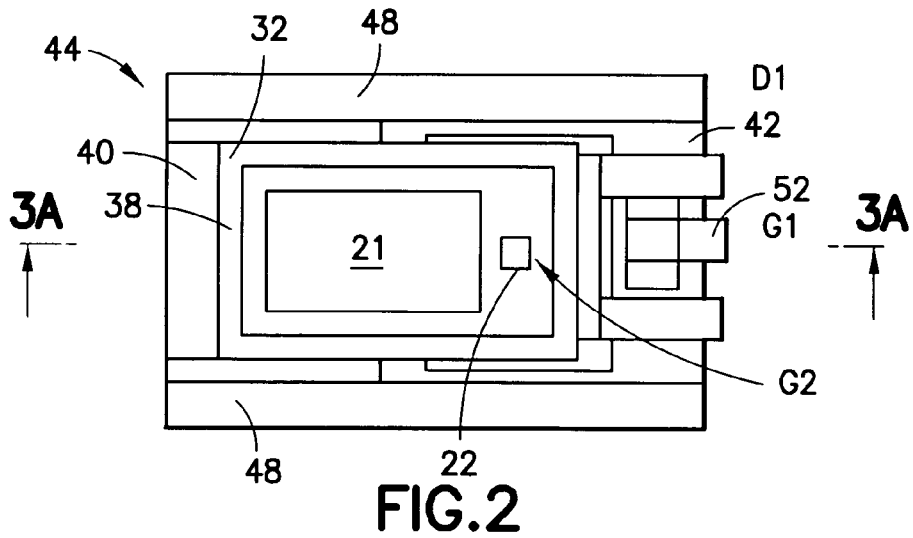
FIG. 2 shows a bottom plan view of a semiconductor package according to the first embodiment of the present invention.
Figure 3A:
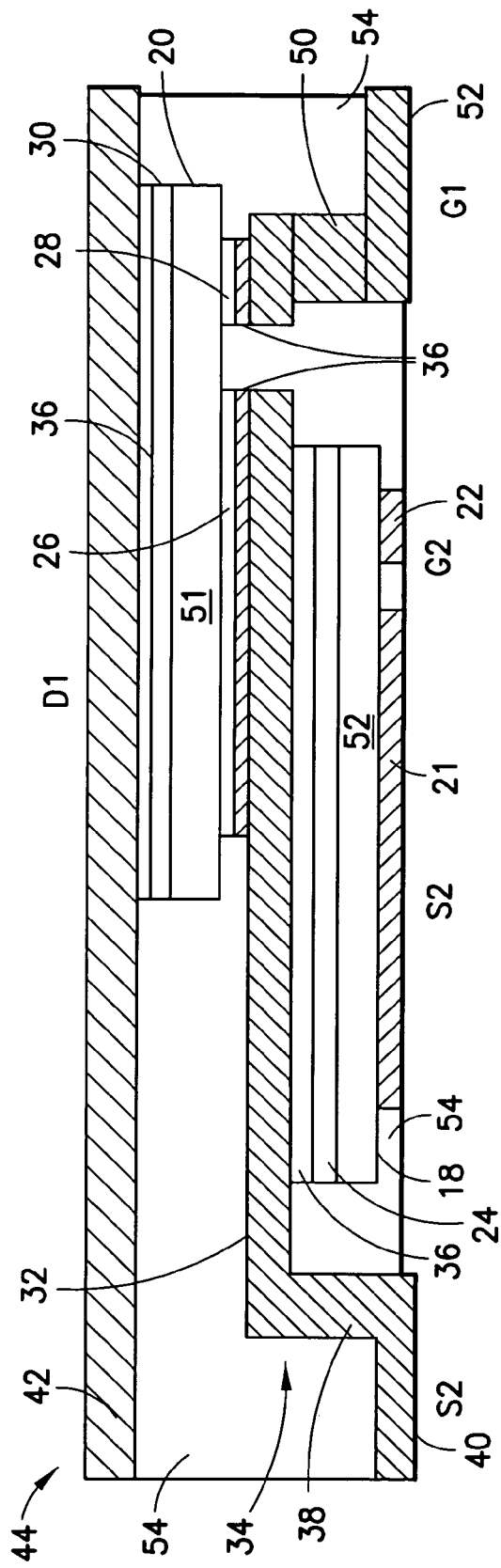
FIG. 3A shows a cross-sectional view of the package of FIG. 2 along line 3A-3A viewed in the direction of the arrows.
Figure 3B:
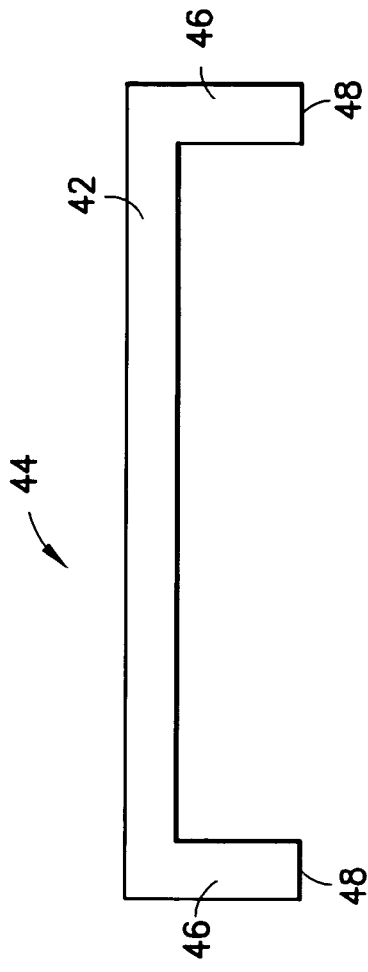
FIG. 3B illustrates a cross-section view of a clip used in a package according to the present invention.

Referring next to FIGS. 2 and 3A-3B, a semiconductor package according to the first embodiment of the present invention includes a first power switch 18 and a second power switch 20. First power switch 18 includes first power electrode 21, control electrode 22 and second power electrode 24 opposite first power electrode 20, and second power switch 20 includes first power electrode 26, control electrode 28, and second power electrode 30 disposed over first power electrode 26. Second power electrode 24 of first power switch 18 is electrically and mechanically coupled to one surface of web portion 32 of first clip 34, through a layer of conductive adhesive 36 (for example solder, or conductive epoxy), and first power electrode 26 of second power switch 20 is electrically and mechanically coupled to an opposing surface of web portion 32 of first clip 34 (formed preferably from a conductive metal such as copper or a suitable alloy thereof) through a layer of conductive adhesive 36 (e.g. solder, or conductive epoxy). First clip 34 further includes a lead 38 extending from an edge of web 32 which terminates at first connection surface 40 designated and configured for electrical and mechanical mounting onto a conductive pad such as a conductive pad on a circuit board or the like. Note that first connection surface 40 is generally coplanar with first power electrode 21 and control electrode 22 of first power switch 18. Second power electrode 30 of second power switch 20 is electrically and mechanically coupled to a web portion 42 of second conductive clip 44 (formed preferably from a conductive metal such as copper or a suitable alloy thereof) with a layer of conductive adhesive 36. Note that second conductive clip 44 includes at least one lead 46 (and preferably two leads) extending from an edge of web portion 44 and terminating at a connection surface 48 which is generally coplanar with first connection surface 40. Control electrode 28 of second power switch 20 is electrically and mechanically coupled to a control connection 50 by a layer of conductive adhesive 36 (e.g. solder or conductive epoxy). Control connector 50 includes a connection surface 52 which is generally coplanar with connection surface 40.

An insulation body 54 (e.g. mold compound or the like) body fills the gaps between the parts and is disposed at least around first switch 18 and second switch 20 to protect the same from the environment.

In the preferred embodiment, first 18 and second 20 power switches are power MOSFET. Thus, first power electrode 21, 26 of each switch is the source electrode, second power electrode 24, 30 of each switch is the drain electrode, and control electrode 22, 28 of each power switch is the gate electrode. A package according to the preferred embodiment may be used in the switching stage of a DC-DC converter (e.g. buck converter) as illustrated by FIG. 1.

FIG. 4 illustrates an alternative arrangement of parts, but in all other respects is identical to the first embodiment of the present invention. Note that connector 50 is arranged between an edge of clip 34 and a lead 46 of clip 42 in this alternative design.

Referring next to FIG. 5, in which like numerals identify like features, in a package according to the second embodiment of the present invention, second power electrode 30 of second power switch 20 is electrically and mechanically coupled to web portion 32 of first clip 34 (in the same manner as the first embodiment), and first power electrode 26 thereof is electrically and mechanically coupled to web portion 42 of second clip 44 (in the same manner as the first embodiment). Furthermore, control electrode 28 of second switch 20 is electrically and mechanically coupled to a control connector 50, which is insulated from web portion 42 of clip 44 through a dielectric body 56. In all other respects a package according to the second embodiment is identical to the first embodiment.

Figure 6:
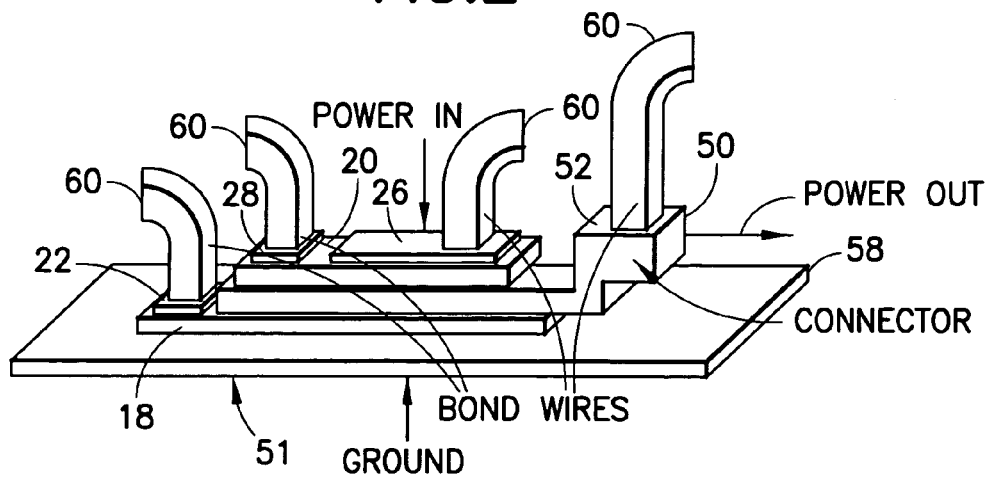
FIG. 6 illustrates a package according to the third embodiment of the present invention.

Referring next to FIG. 6, in which like numerals identify like features, in a package according to the third embodiment, second clip 44 is replaced with a conductive plate 58 (e.g. copper plate) which is electrically and mechanically coupled through a conductive adhesive to second power electrode 30 of second power switch 20. Note that conductive plate 58 does not include any leads, but includes a free surface 51 opposite second power electrode 30 which can be used for external connection. Furthermore, connector 50 is eliminated and control electrode 28, control electrode 22, first power electrode 21, and connection surface 40 are wire bonded through wirebonds 60 to respective leads (not shown) for external connection. The package then can be overmolded with mold compound or the like (not shown) in a conventional manner. A package according to the third embodiment is otherwise arranged identical to the first embodiment.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power semiconductor package, comprising:
one power semiconductor device having a first power electrode and a control electrode that is coplanar with a first power electrode on one surface thereof and a second power electrode on another opposite surface thereof;
another power semiconductor device having a first power electrode and a control electrode that is coplanar with said first power electrode on one surface thereof and a second power electrode on another opposite surface thereof;
a first conductive clip having a web portion and a lead extending from an edge of said web portion and terminating at a first connection surface coplanar with said first power electrode and said control electrode of said one power semiconductor device, said web portion of said first conductive clip including a first surface electrically and mechanically connected to said second electrode of said one power semiconductor device and a second surface opposite said first surface electrically and mechanically connected to one of said power electrodes of said another power semiconductor device;
a control connector electrically connected to said control electrode of said another power semiconductor device, said control connector terminating at a connection surface that is coplanar with said first connection surface, said first electrode of said one power semiconductor device and said control electrode of said one power semiconductor device; and
a second conductive clip having a web portion electrically and mechanically coupled to the other one of said power electrodes of said another power semiconductor device, said second conductive clip including a lead extending from an edge of said web portion thereof and terminating at a second connection surface that is coplanar with said first connection surface, said first power electrode of said one power semiconductor device, said control electrode of said one power semiconductor device, and said connection surface of said control connector.

2. The power semiconductor package of claim 1, wherein said second surface is electrically and mechanically connected to said first power electrode of said another semiconductor device.

3. The power semiconductor package of claim 2, wherein said web portion of said second conductive clip is electrically and mechanically connected to said second power electrode of said another power semiconductor device.

4. The power semiconductor package of claim 1, further comprising an insulation body disposed around said one and said another power semiconductor devices.

5. The power semiconductor package of claim 1, wherein said second surface is electrically and mechanically connected to said second power electrode of said another semiconductor device.

6. The power semiconductor package of claim 5, wherein said web portion of said second conductive clip electrically and mechanically connected to said first power electrode of said another power semiconductor device.

7. The power semiconductor package of claim 1, wherein said control connector is insulated from said second conductive clip.

8. The power semiconductor package of claim 1, wherein said second surface is electrically and mechanically connected to said first power electrode of said another semiconductor device, and said first power electrode of said one power semiconductor device is wirebonded to a respective lead.

9. The power semiconductor package of claim 8, wherein said one power semiconductor device includes a control electrode wirebonded to a respective lead, and said another power semiconductor device includes a control electrode wirebonded to a respective lead.

10. The power semiconductor package of claim 1, wherein said first connection surface is wirebonded to a respective lead.

11. The power semiconductor package of claim 1, further comprising a plastic housing encapsulating at least said one and said another power semiconductor devices, wherein said second power electrode of said another semiconductor device is exposed through said housing and rendered accessible for external connection.

12. The power semiconductor package of claim 1, wherein said first and said second power semiconductor devices are power MOSFETs.

* * * * *

UNITED STATES PATENT AND TRADEMARK OFFICE
CERTIFICATE OF CORRECTION

Page 1 of 1

PATENT NO. : 7,615,854 B2
APPLICATION NO. : 11/592407
DATED : November 10, 2009
INVENTOR(S) : Robert Montgomery It is certified that error appears in the above-identified patent and that said Letters Patent is hereby corrected as shown below:

Claims, column 4, line 40, --is-- should be inserted before "electrically".

Signed and Sealed this
First Day of November, 2011

David J. Kappos
*Director of the United States Patent and Trademark Office*